US 6,683,488 B2

(12) United States Patent
Jin

(10) Patent No.: US 6,683,488 B2
(45) Date of Patent: Jan. 27, 2004

(54) CHARGE PUMP CIRCUIT FOR SEMICONDUCTOR DEVICE

(75) Inventor: Seung Eon Jin, Seoul (KR)

(73) Assignee: Hynix Semiconductor, Inc., Kyoungki-do (KR)

(*) Notice: Subject to any disclaimer, the term of this patent is extended or adjusted under 35 U.S.C. 154(b) by 131 days.

(21) Appl. No.: 10/028,685

(22) Filed: Dec. 28, 2001

(65) Prior Publication Data

US 2002/0084832 A1 Jul. 4, 2002

(30) Foreign Application Priority Data

Dec. 30, 2000 (KR) ........................................ 2000/87290

(51) Int. Cl.[7] ................................................ G05F 1/10
(52) U.S. Cl. ........................ 327/536; 327/534; 327/535
(58) Field of Search ................................. 327/534, 535, 327/536, 390, 590

(56) References Cited

U.S. PATENT DOCUMENTS

| 5,905,400 A | * | 5/1999 | Runkel | 327/390 |
| 5,933,047 A | * | 8/1999 | Zhu et al. | 327/534 |
| 6,157,242 A | * | 12/2000 | Fukui | 327/536 |
| 6,353,356 B1 | * | 3/2002 | Liu | 327/536 |

* cited by examiner

*Primary Examiner*—Tuan T. Lam
*Assistant Examiner*—Hiep Nguyen
(74) *Attorney, Agent, or Firm*—Birch, Stewart, Kolasch & Birch, LLP

(57) ABSTRACT

A charge pump circuit with improved pump efficiency and usable in a semiconductor memory device, includes a charge node, a pump capacitor for pumping charges of the charge node, a charge transfer transistor connected between the charge node and an output node so as to transfer the charges of the pumped charge node, a charging transistor for charging the charge node with a predetermined voltage, and a first transistor coupled to the charge node for preventing flowback of charges from an output node to the charge node during a charging interval.

8 Claims, 2 Drawing Sheets

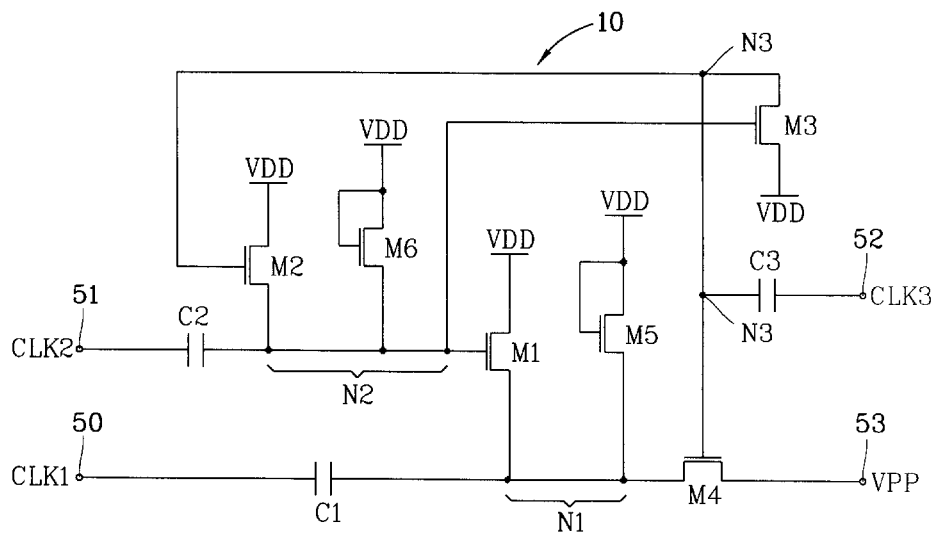
FIG. 1
BACKGROUND ART
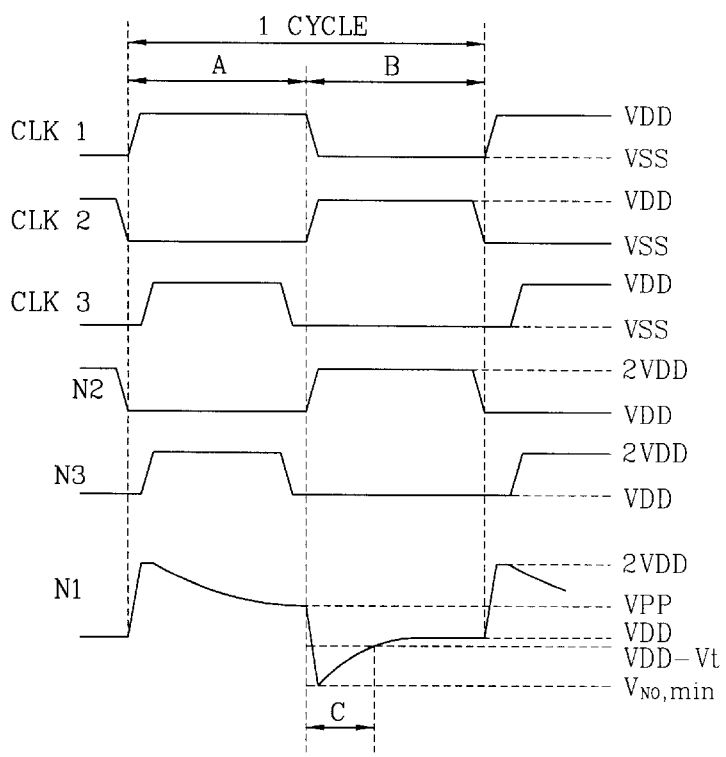
FIG. 2A BACKGROUND ART
FIG. 2B BACKGROUND ART
FIG. 2C BACKGROUND ART
FIG. 2D BACKGROUND ART
FIG. 2E BACKGROUND ART
FIG. 2F BACKGROUND ART

US 6,683,488 B2

CHARGE PUMP CIRCUIT FOR SEMICONDUCTOR DEVICE

RELATED APPLICATION

The present application claims the benefit of Korean Patent Application No. 87290/2000 filed Dec. 30, 2000, which is herein fully incorporated by reference.

BACKGROUND OF THE INVENTION

1. Field of the Invention

The present invention relates to a charge pump memory device, and more particularly, to a charge pump device for a semiconductor memory device which produces a step-up voltage for driving wordlines and equalizing bitlines.

2. Background of the Related Art

FIG. 1 is a circuit diagram of a charge pump circuit 10 for a semiconductor device such as a memory device according to a related art. As shown in FIG. 1, the charge pump circuit 10 in a semiconductor memory device according to a related art is constructed with three capacitors C1 to C3 and six NMOS transistors M1 to M6, operatively coupled. The NMOS transistors M1 to M3 are charge transistors for respectively charging nodes N1 to N3 to a VDD voltage level, and the capacitor C1 is a pump capacitor for pumping charges of the node N1 up to 2VDD. The pump capacitor C1 is generally larger in size than other capacitors C2 and C3 so as to cope properly with the current consumption of the pump circuit 10.

The NMOS transistors M5 and M6 are diode type transistors and supply the nodes N1 and N2 with a VDD voltage level. The NMOS transistor M4 is a transfer transistor for transferring the charges at the node N1. The capacitors C1 to C3 are connected between input nodes 50 to 52 and the nodes N1 to N3, respectively. The NMOS transistors M1 to M3 are connected between the voltage power source VDD and the respective nodes N1 to N3. The gates of the NMOS transistors M1 and M3 are connected to the node N2 in common, while the gates of the NMOS transistors M2 and M4 are connected to the node N3.

FIGS. 2A–2F are waveforms for explaining a one-cycle operation of the pump circuit 10 shown in FIG. 1. As shown in FIGS. 2A–2F, an interval A is a pumping interval of the pump capacitor C1, and an interval B is a charge interval of the pump capacitor C1. During the interval A, the charge at the node N1 is pumped up to 2VDD which is transferred to an output node 53 through the NMOS transistor M4. During the interval B, the node N1 is charged up to VDD through the NMOS transistor M1 for the pumping operation of a next cycle.

Just before the beginning of the cycle, when a second clock signal CLK2 is shifted from VDD to VSS, the potential at the node N2 is dropped down to VDD from 2VDD due to capacitive coupling (hereinafter "coupling") provided by the capacitor C2. The NMOS transistors M1 and M3 are then turned off by the potential VDD of the node N2.

Then, at the beginning of the cycle as a first clock signal CLK1 is shifted up from VSS to VDD, the current potential VDD of the node N1 having been charged with VDD during the previous cycle rises up to 2VDD due to the pumping operation (coupling) of the pumping capacitor C1. Then, as a third clock signal CLK3 is shifted up from VSS to VDD, the potential of the node N3 having been charged with VDD by the previous cycle rises up to 2VDD by the coupling of the capacitor C3. Then, the potential 2VDD of the node N3 turns on the NMOS transistors M2 and M4. As a result, the charges 2VDD of the node N1 having been pumped by the pump capacitor C1 are transferred to the output node 53 through the NMOS transistor M4, and the N2 is charged with the power source voltage VDD provided through the NMOS transistor M2. Consequently, the potential VPP of the output node 53 is increased or pumped by the charges transferred through the NMOS transistor M4.

Subsequently, when the third clock signal CLK3 is shifted down from VDD to VSS in the interval A, the potential of the node N3 is dropped from 2VDD to VDD by the coupling of the capacitor C3, thereby turning off the NMOS transistors M2 and M4. The turned-off NMOS transistor M4 separates electrically the node N1 from the output node 53 and the potential VPP of the output node 53 is maintained.

In the interval B, when the first clock signal CLKI is shifted down from VDD to VSS, the node N1 having the same potential of the output node 53 in the interval A tends to drop down to VNO, min by the coupling of the capacitor C1 having a very large capacitance. In this case, since the second clock signal CLK2 is shifted up from VSS to VDD, at the same time the first clock signal CLK1 is shifted down, the potential of the node N2 is increased from VDD to 2VDD by the coupling of the capacitor C2 and the node N3 is charged with VDD by the NMOS transistor M3. The NMOS transistor M1 is then turned on by the potential 2VDD of the node N2, thereby charging the node N1 with VDD, so that the potential of the node N1 begins to rise.

However, the potential of the node N1 experiences an RC delay due to the influence of the resistance (RM1) of the NMOS transistor M1, the pump capacitor C1, and the junction capacitance produced by the NMOS transistors M1, M4, and MS. Namely, since the charge supplied through the NMOS transistor M1 is not transferred to the node N1 fast enough to cope with the abrupt potential drop at the node N1 as shown in the interval C of FIG. 2F, the potential of the node N1 is dropped down to a level much lower than VDD–Vt1 wherein Vt1 is, a threshold voltage of the NMOS transistor M4.

On the other hand, the NMOS transistor M5 is turned on at the moment when the potential of the node N1 reaches VDD–Vt2 wherein Vt2 is a threshold voltage of the NMOS transistor M5, thereby charging the node N1 with VDD. Yet, the charge supplied by the NMOS transistor M5 is not transferred to the node N1 fast enough due to the turn-on resistance of the NMOS transistor M5 and the capacitance of the node N1. As a result, the NMOS transistor M5, as shown in FIG. 2F, starts to operate at the moment when the node N1 is dropped below VDD–Vt1, but is not able to cope quickly with the abrupt potential drop of the node N1 caused by the coupling of the capacitor C1. Thus, during the interval C, the NMOS transistor M4 is turned on since a voltage difference Vgs between the gate and source voltages of the NMOS transistor M4 is larger than the threshold voltage Vt1 of the NMOS transistor M4. The charge VPP having been transferred to the output node 53 during the interval A then flows back to the node N1 through the NMOS transistor M4, which decreases the pump efficiency of the pump circuit 10.

As mentioned in the above explanation, when the operation cycle of the circuit 10 moves from the interval A to the interval B, the pump circuit 10 according to the related art fails to cope quickly with the abrupt potential drop of the node N1 occurring due to the coupling of the pump capacitor C1. This is because charging of the node N1 with VDD through the NMOS transistor M1 is delayed by the turn-on resistance of the NMOS transistor M1, the capacitance of the pump capacitor C1, and the parasitic capacitance of the node N1. Consequently, the potential of the node N1 is dropped to below VDD. This turns on the NMOS transistor M4 which in turn causes charges from the output node 53 to flow back to the node N1. The charges VPP at the output node 53 of the pump circuit 10 is essentially equal to "(supply amount in interval A)-(influx in interval B)." As such, the pump efficiency of the pump circuit 10 according to the related art is decreased by at least the amount of the flow-back charges.

SUMMARY OF THE INVENTION

Accordingly, the present invention is directed to a charge pump circuit and method for a semiconductor memory device with increased pump efficiency that substantially obviates one or more problems due to limitations and disadvantages of the related art.

An object of the present invention is to provide a charge pump circuit and method for a semiconductor memory device that improves pumping efficiency by preventing charges at an output node from flowing back to the pump circuit during a charge interval.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a charge pump circuit according to an embodiment of the present invention includes a charge node, a pump capacitor for pumping charges of the charge node, a charge transfer transistor connected between the charge node and an output node so as to transfer the charges of the pumped charge node, a charging transistor for charging the charge node with a predetermined voltage, and a first transistor coupled to the charge node for preventing flow-back to charges an output node to the charge node during a charging interval.

In another aspect of the present invention, a pump circuit usable in a semiconductor device, includes a pump capacitor connected between an input terminal of a first clock signal and a charge node, a charging transistor for charging the charge node with a first voltage, a charge transfer transistor for transferring charges of the pumped charge node to an output node, and a first transistor connected between a gate of the charge transfer transistor and the charge node and being controlled by a gate voltage of the charging transistor.

In still another aspect of the present invention, a method of pumping charges using a pump circuit in a semiconductor device, includes the steps of pumping charges of a charge node of the pump circuit during a pumping interval of a cycle of the pump circuit, transferring the charges of the pumped charged node to an output node during the pumping interval using a charge transfer transistor, and maintaining a turn-off state of the charge transfer transistor during an entire charging interval of the cycle to prevent flow-back of charges from the output node to the charge node during the charging interval of the cycle.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIG. 1 illustrates a pump circuit in a semiconductor memory device according to a related art;

FIGS. 2A–2F illustrate waveforms for explaining a one-cycle operation of the pump circuit in FIG. 1;

FIGS. 4A–4F illustrate examples of waveforms for explaining a one-cycle operation of the pump circuit in FIG. 3 according to one embodiment of the present invention.

DETAILED DESCRIPTION OF THE PREFERRED EMBODIMENTS

Figure 3:
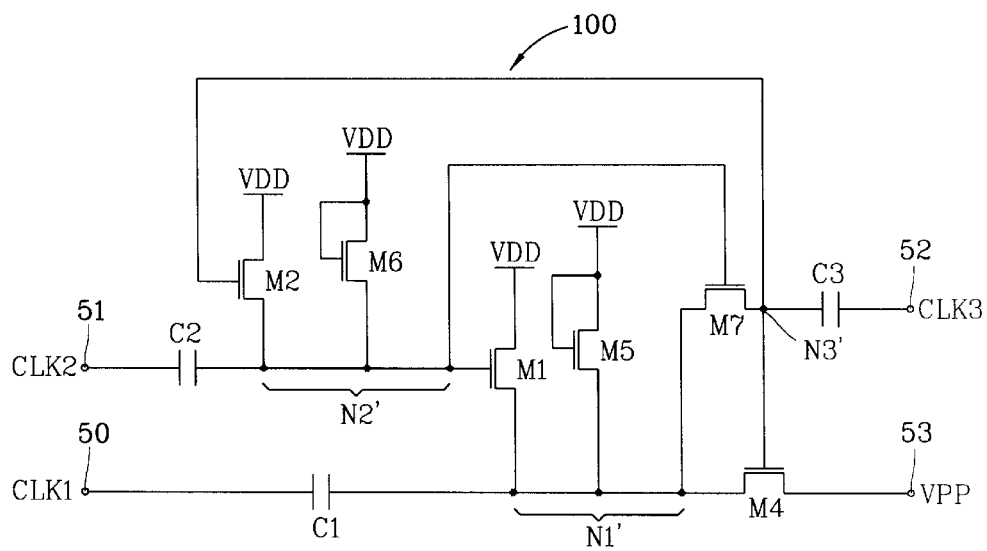
FIG. 3 illustrates a pump circuit for a semiconductor device according to one embodiment of the present invention.
Figure 3:
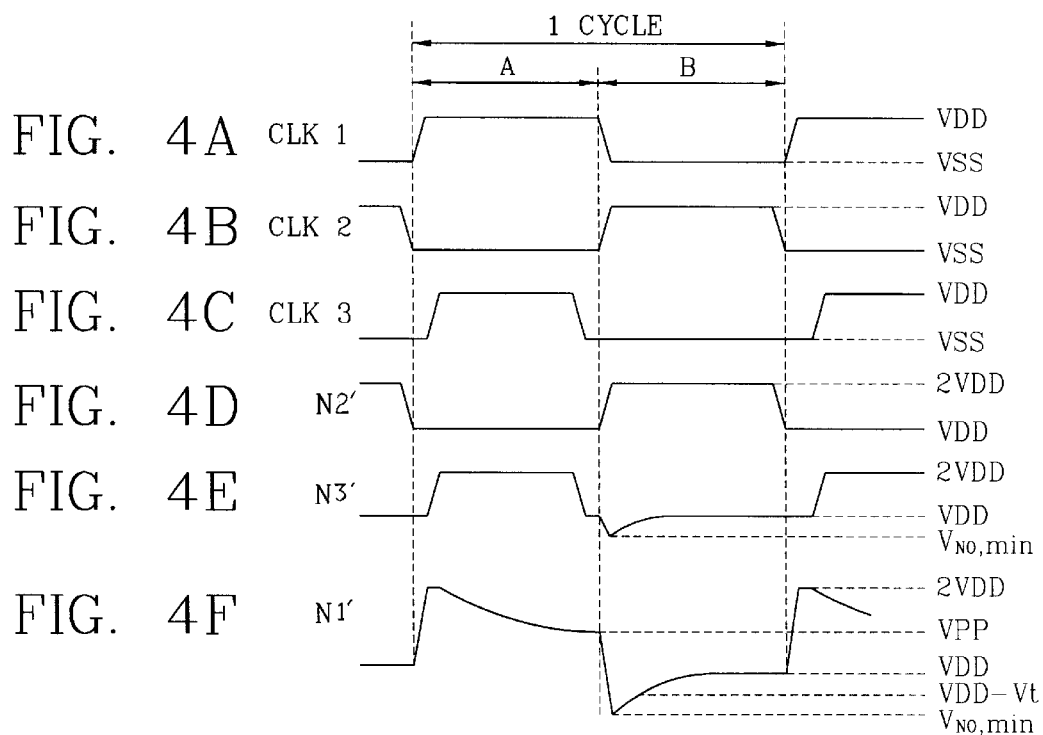

Reference will now be made in detail to the preferred embodiments of the present invention, examples of which are illustrated in the accompanying drawings. The same reference numerals are used to indicate the same elements.

FIG. 3 illustrates a charge pump circuit 100 usable in a semiconductor device such as a memory device according to one embodiment of the present invention. Generally, the circuit 100 is similar to the circuit 10 of FIG. 1, except that the NMOS transistor M3 of the circuit 10 is not present in the circuit 100 of the present invention, and an NMOS transistor M7 is connected between a gate of the NMOS transistor M4 and a node N1' where a gate of the NMOS transistor M7 is connected to a node N2'. All the elements shown in FIG. 3 are operatively coupled.

The capacitor C2 and NMOS transistors M2 and M6 constitute a first control part for controlling a gate voltage of the NMOS transistor M1, and the capacitor C3 constitutes a second control part for controlling a gate voltage of the NMOS transistor M4.

FIGS. 4A–4F are examples of waveforms for explaining a one-cycle operation of the pump circuit 100 in FIG. 3. Referring to FIGS. 4A–4F, the operation of the pump circuit 100 according to one embodiment of the present invention is explained as follows.

In the interval A (pumping interval) of a cycle of the circuit 100, when the second clock signal CLK2 is shifted down to VSS, the node N2' is charged with VDD. This turns off the NMOS transistor M7 so as to separate electrically the node N1' from the node N3'. The operation of other parts therein occurs consistent with that of the related art.

When the third clock signal CLK3 is shifted down from VDD to VSS at or near the turning point from the interval A to the interval B (charge interval), the node N3' drops from 2VDD to VDD so as to turn off the NMOS transistors M2 and M4. Thereafter, when the first clock signal CLK1 is shifted from VDD to VSS, the node N1' tends to drop down to [VPP−VDD] due to capacitive coupling provided by the pump capacitor C1. At the same time, the second clock signal CLK2 is shifted from VSS to VDD. Thus, the node N2' is stepped up to 2VDD by the capacitor C2, whereby the node N1' is charged with VDD through the NMOS transistor.

In this case, since the turning-on of the NMOS transistor M7 depends on the potential of the node N2', the potential of the node N3' having dropped down to VDD, as shown in FIG. 4F, is further dropped (e.g., to VNO, min) along the potential drop of the node N1'. Namely, the voltage of the node N1' is as good as that of the node N3' since the potential of the node N3' tracks that of the node N1'.

Therefore, a voltage difference Vgs between the gate and source voltages of the NMOS transistor M4 becomes lower than its threshold voltage Vt1, whereby the NMOS transistor M4 maintains a turned-off state. As a result, the charges are prevented from flowing back to the node N1' from the output node 53 in the interval B.

As mentioned in the above description, in a charge pump circuit for a semiconductor memory device according to an embodiment of the present invention, an NMOS transistor (M7) is connected between a gate of a charge transfer transistor (M4) and a pumping/charge node (N1') of a pump capacitor (C1) and the gate of the NMOS transistor (M7) is connected to a gate of an NMOS transistor (M1) functioning as a charging transistor for charging the pumping node (N1') with VDD.

Although the present invention has been described with the use of NMOS transistors, the concepts and principles of the present invention are not limited to such and are applicable to other types of charge pump circuits including circuits where different types of transistors are used.

Accordingly, the present invention improves significantly the efficiency of a charge pump circuit by preventing the charges, which conventionally flow from an output node back to the pumping node, from back-drafting therebetween by having a gate voltage of the charge transfer transistor to track down the pumping node when a pumping interval is switched to a charge interval.

The forgoing embodiments are merely exemplary and are not to be construed as limiting the present invention. The present teachings can be readily applied to other types of apparatuses and methods. The description of the present invention is intended to be illustrative, and not to limit the scope of the claims. Many alternatives, modifications, and variations will be apparent to those skilled in the art.

What is claimed is:

1. A pump circuit usable in a semiconductor device, the circuit comprising:

a pump capacitor connected between an input terminal of a first clock signal and a charge node;

a charging transistor for charging the charge node with a first voltage;

a charge transfer transistor for transferring charges of the pumped charge node to an output node; and a first transistor connected between a gate of the charge transfer transistor and the charge node and being controlled by a gate voltage of the charging transistor.

2. The pump circuit of claim 1, wherein the gate voltage of the charge transfer transistor tracks a voltage of the charge node.

3. The pump circuit of claim 1, wherein the first transistor becomes turned off in a pumping interval of a cycle, but is turned off in a charging interval of the cycle.

4. The pump circuit of claims 1, further comprising:

a first control part for controlling the charging transistor in accordance with a second clock signal and a gate voltage of the charge transfer transistor.

5. The pump circuit of claim 4, wherein the first control part includes:

a first capacitor connected between an input terminal of the second clock signal and the gate of the charging transistor; and a second transistor for charging the gate of the charging transistor with the first voltage in accordance with a gate voltage of the first transistor.

6. The pump circuit of claim 1, further comprising:

a second control part controlling the charge transfer transistor in accordance with a third clock signal.

7. The pump circuit of claim 6, wherein the second control part includes a second capacitor connected between an input terminal of the third clock signal and a gate of the charge transfer transistor.

8. The pump circuit of claim 1, wherein the charge transfer transistor is turned on in a pumping interval of a cycle, but turned off during an entire charging interval of the cycle.

* * * * *